United States Patent
Kimoto

(10) Patent No.: US 9,302,397 B2
(45) Date of Patent: Apr. 5, 2016

(54) PREDICTION SYSTEM

(71) Applicant: KABUSHIKI KAISHA YASKAWA DENKI, Kitakyushu-shi (JP)

(72) Inventor: Kazuhiko Kimoto, Kitakyushu (JP)

(73) Assignee: KABUSHIKI KAISHA YASKAWA DENKI, Kitakyushu-Shi (JP)

( * ) Notice: Subject to any disclaimer, the term of this patent is extended or adjusted under 35 U.S.C. 154(b) by 16 days.

(21) Appl. No.: 14/289,585

(22) Filed: May 28, 2014

(65) Prior Publication Data

US 2014/0358279 A1   Dec. 4, 2014

(30) Foreign Application Priority Data

May 30, 2013   (JP) ................................. 2013-114494

(51) Int. Cl.
| | |
|---|---|
| G06F 19/00 | (2011.01) |
| B25J 19/00 | (2006.01) |
| G05B 23/02 | (2006.01) |
| G01R 31/02 | (2006.01) |

(52) U.S. Cl.
CPC ......... B25J 19/0025 (2013.01); G05B 23/0289 (2013.01); G01R 31/021 (2013.01); G05B 23/0235 (2013.01); G05B 23/0283 (2013.01); Y10S 901/03 (2013.01)

(58) Field of Classification Search
CPC ... B25J 9/1656; B25J 19/0025; Y10S 901/03; G05B 23/0289; G05B 23/0235; G05B 23/0283; G01R 31/021
USPC .......................... 700/245; 901/1; 324/750.01
See application file for complete search history.

(56) References Cited

U.S. PATENT DOCUMENTS

| | | | | |
|---|---|---|---|---|
| 5,637,241 | A * | 6/1997 | Moates | 219/109 |
| 6,450,036 | B1 * | 9/2002 | Ashida et al. | 73/584 |
| 7,992,449 | B1 * | 8/2011 | Mahmoud | 73/828 |
| 2003/0216888 | A1 * | 11/2003 | Ridolfo | 702/181 |
| 2013/0154676 | A1 * | 6/2013 | Wu et al. | 324/750.01 |

FOREIGN PATENT DOCUMENTS

| | | | | |
|---|---|---|---|---|
| JP | 01-262080 | | 10/1989 | |
| JP | 2002-056726 | | 2/2002 | |
| JP | 2004309277 | A * | 11/2004 | ............ G01N 21/35 |
| JP | 2007-299608 | | 11/2007 | |
| WO | WO 2012/061979 | | 5/2012 | |

OTHER PUBLICATIONS

Inoue et al., "Study of a Method to Predict the Bending Reliability of Wiring Harnesses", Sei Technical Review, Sumitomo Electric Industories, Osaka, No. 51, Jan. 1, 2001, pp. 91-95, XP008042306.
Extended European Search Report for corresponding EP Application No. 14169610.4-1802, Feb. 20, 2015.
Chinese Office Action for corresponding CN Application No. 201410131119.2, Jul. 29, 2015.

* cited by examiner

Primary Examiner — Jaime Figueroa
(74) Attorney, Agent, or Firm — Mori & Ward, LLP

(57) ABSTRACT

A prediction system includes an acquisition device, an execution device, and a prediction device. The acquisition device is configured to acquire a value of electric resistance of a cable secured by fixing members to a pair of link members configured to rotate relative to each other through a joint. The execution device is configured to cause the joint to execute a predetermined operation. The prediction device is configured to predict a service life of the cable based on a change in the value of electric resistance acquired by the acquisition device while the execution device is causing the joint to execute the predetermined operation.

14 Claims, 10 Drawing Sheets

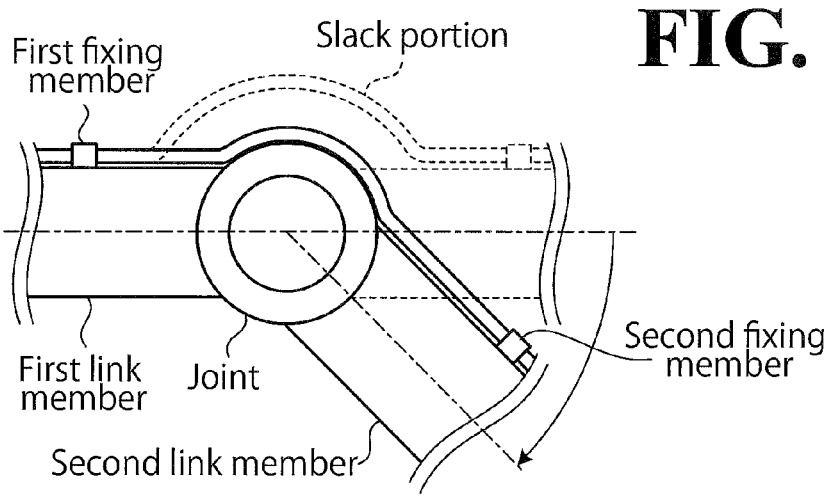
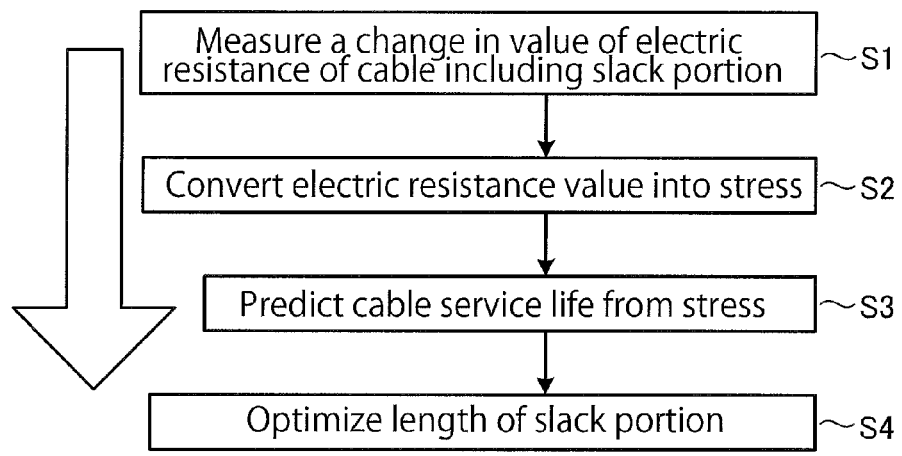
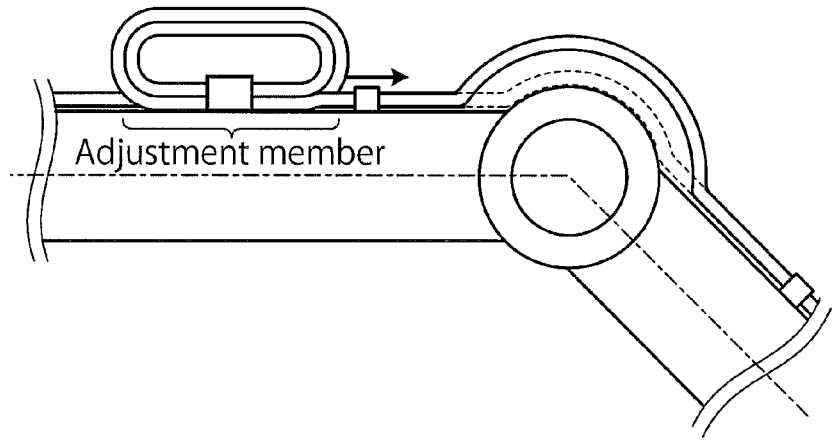
FIG. 1

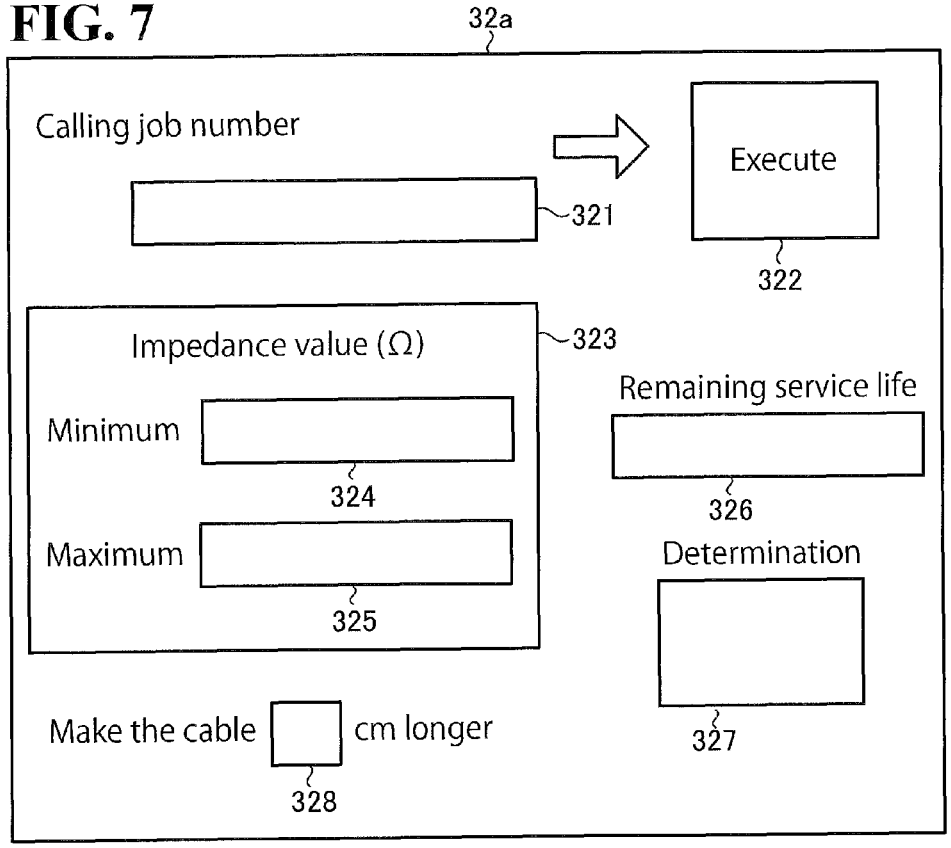
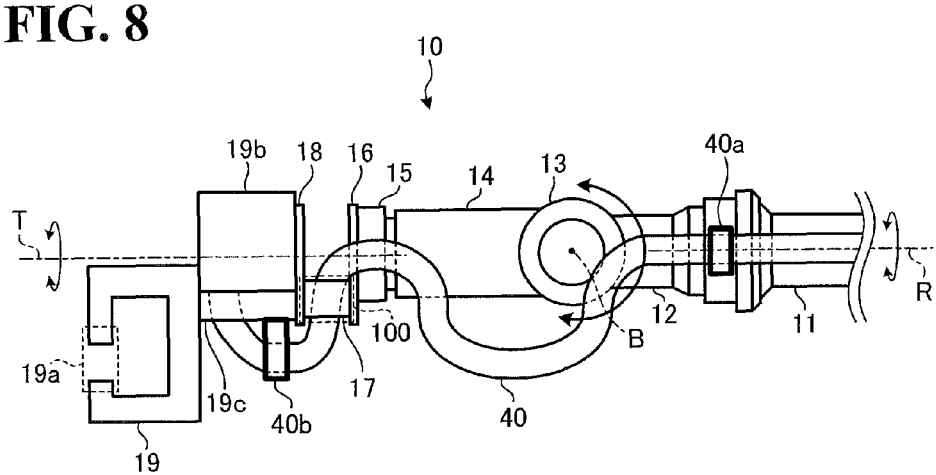

PREDICTION SYSTEM

CROSS-REFERENCE TO RELATED APPLICATIONS

The present application claims priority under 35 U.S.C. §119 to Japanese Patent Application No. 2013-114494, filed May 30, 2013. The contents of this application are incorporated herein by reference in their entirety.

BACKGROUND

1. Field of the Invention

The present invention relates to a prediction system.

2. Discussion of the Background

Conventionally, industrial robots such as spot welders are arranged on production lines to engage in processing such as sheet-metal processing for automobiles. The spot welders are provided with welding guns to weld various portions of an automobile body. For this purpose, the welding guns need to be capable of three-dimensional movement such as reverse rotation and swing movement. This involves repeated twisting and bending of a welding cable coupled to the welding gun, which in turn causes accumulated wear over time resulting in disconnection. Thus, as equipment maintenance, it is necessary to replace the welding cable before the disconnection occurs.

In order to grasp the time to replace the welding cable, it is necessary to implement a continuous monitoring system. It is difficult or impossible, however, to find an internal disconnection merely by visually observing the exterior of the cable. In view of this, common practice is to continuously monitor the value of electric resistance of the cable so as to estimate the deterioration of the cable, that is, the level of disconnection. For example, Japanese Unexamined Patent Application Publication No. 1-262080 discloses a prediction system that continuously monitors the electric resistance of a cable so as to predict a breakage.

SUMMARY

According to one aspect of the present disclosure, a prediction system includes an acquisition device, an execution device, and a prediction device. The acquisition device is configured to acquire a value of electric resistance of a cable secured by fixing members to a pair of link members configured to rotate relative to each other through a joint. The execution device is configured to cause the joint to execute a predetermined operation. The prediction device is configured to predict a service life of the cable based on a change in the value of electric resistance acquired by the acquisition device while the execution device is causing the joint to execute the predetermined operation.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein:

FIG. 1 is a diagram illustrating a method for predicting a cable disconnection according to an embodiment;

FIG. 7 is a diagram illustrating an operation window of a notification section;

FIG. 8 is a diagram illustrating how the cable is mounted to a wrist of the robot;

DESCRIPTION OF THE EMBODIMENTS

Figure 2:
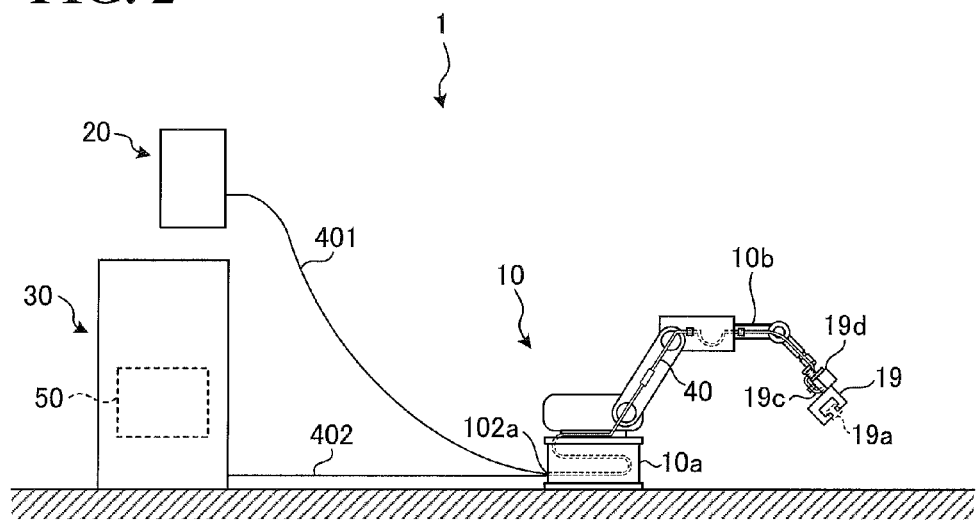
FIG. 2 is a diagram illustrating a configuration of a robot system.

A prediction system according to an embodiment of the present application will be described in detail below by referring to the accompanying drawings. The following embodiment is provided for exemplary purposes only and is not intended to limit the present invention.

A prediction system according to an embodiment will be described by referring to FIG. 1. FIG. 1 is a diagram illustrating a method of predicting a disconnection of a cable according to the embodiment. As shown in FIG. 1, a cable serving as a conductive member is secured to a first link member and a second link member respectively by a first fixing member and a second fixing member. The first link member and the second link member are rotatably coupled with each other through a joint.

The portion of the cable defined by the first fixing member and the second fixing member at both ends is a slack portion. The slack portion has an extra length to allow for the movement of the first link member and the second link member in conjunction with the movement of the joint. Each fixing member is repeatedly attachable to or detached from the corresponding link member. This ensures that the length of the slack portion can be adjusted with the fixing member temporarily detached, and after the adjustment, the cable can be secured with the fixing member re-attached. When the relative angle between the first link member and the second link member changes, the slack portion is subjected to stress of bending and/or twisting. The positions of the fixing members and the shape of the slack portion shown in FIG. 1 are provided for exemplary purposes only.

Even though the stress of bending and/or twisting on the slack portion caused by a single movement of the link members may be small, the stress is accumulated in the slack portion as wear through repetitive movement of the link members. This ultimately results in a breakage, that is, a cable disconnection. In view of this, the prediction system according to this embodiment predicts the service life of the cable sufficiently before the disconnection occurs. The service life ends upon breakage and disconnection of the slack portion of the cable, that is, when the cable is disconnected, due to the movement of the link members.

In order to predict the service life that ends upon breakage of the slack portion due to wear, it is possible to directly measure and use the stress applied to the slack portion. It is more preferable to use electric resistance values, which are easier to measure, and convert an electric resistance value into stress. This is because under stress due to bending and/or twisting, the slack portion changes its length and cross-sectional area in accordance with the applied stress, and the electric resistance value changes accordingly. Thus, the prediction system according to this embodiment measures a change in the value of electric resistance of the cable including the slack portion (step S1), and converts the electric resistance value into stress (step S2).

When the cable is in the form of a wire as in the material according to this embodiment, the stress applied in the longitudinal direction of the slack portion is approximately proportional to the value of electric resistance in the longitudinal direction of the slack portion. In view of this, an amplitude of change in the stress applied to the slack portion is obtained based on the measured electric resistance value, and the amplitude of change is used to evaluate the service life of the slack portion, described later. It is possible to obtain the amplitude of change in the stress by converting an amplitude of change in the electric resistance value, or by calculating an amplitude of change in the converted stress.

The service life starts when a cable without any wear is attached and ends when the slack portion is broken by the accumulation of wear due to bending and/or twisting. It is possible to estimate the service life as the number of times a predetermined operation of the link members is repeatable. This, however, should not be construed in a limiting sense. It is also possible to estimate the service life as a period of time for which the cable is usable and which is obtained by converting the time required for a predetermined movement of the link members.

Thus, the prediction system according to this embodiment converts the value of electric resistance resulting from deformation of the slack portion of the cable into an amplitude of change in stress. The slack portion is disposed across the link members capable of moving relative to each other. This ensures estimation of the service life, which starts when the slack portion of the cable without any wear is attached to the link members and ends when the slack portion is broken due to accumulated wear. Thus, the service life of the cable is predicted from the stress (step S3).

The service life predicted based on the electric resistance value is compared with a threshold as a guaranteed value of the cable service life. When the predicated service life is equal to or longer than the threshold, the guaranteed service life of the cable is ensured. Thus, the link members including the slack portion can be used in the current condition without any inconvenience. When the predicated service life is shorter than the threshold, it is necessary to reduce the stress applied to the slack portion so as to increase the service life.

Here, a relationship between the cable length of the slack portion and the stress applied to the portion will be described. With a displacement of the slack portion causing a change in the electric resistance value, less stress is applied to the slack portion as the slack portion is longer. Thus, extending the slack portion with respect to an operation of the joint reduces the stress applied to the portion, which extends the service life that ends with wear-caused breakage. Adjusting the cable length of the slack portion would be one of the easiest practical ways of adjusting the service life.

An adjustment member is disposed beside the pair of fixing members for securing the slack portion. The adjustment member has an adjustment length for adjusting the cable length of the slack portion. When the predicted service life of the slack portion is shorter than the threshold, the adjustment member is used to increase the length of the slack portion. With the electric resistance value fixed, the cable length of the slack portion is approximately inverse-proportional to the stress applied to the portion. Based on this relationship, an adjustment length to be increased is estimated from an amount of stress to be reduced, which is the difference between the stress applied to the slack portion at the time of measurement and the stress applied to the slack portion having the above-described threshold. That is, the length of the slack portion is optimized (step S4).

Thus, the prediction system according to this embodiment predicts the service life against wear-caused breakage of the target slack portion by simply measuring the value of electric resistance of the cable including the slack portion. Specifically, the value of electric resistance of the slack portion of the cable is measured by bringing the joint disposed along the slack portion into movement at least once when the cable is installed. The predicted service life is compared with the threshold as the guaranteed value of the cable service life. This ensures determination as to appropriateness of the installation conditions of the slack portion such as the length of the slack portion. When the predicted service life is shorter than the threshold of the cable service life, the length of the slack portion of the cable to be adjusted is estimated based on the stress predicted from the measured electric resistance value.

Thus, the prediction system according to this embodiment optimizes the installation conditions of the slack portion such as the length of the slack portion. This is achieved simply by bringing the joint disposed along the slack portion of the target cable into movement at least once when the cable is installed, and measuring the value of electric resistance of the cable including the slack portion. Conventional practice is to set the length of the slack portion of the cable based on an operator's experience and intuition. This has cause situations in which the service life of the slack portion is shorter than the guaranteed value of the cable, and in which the service life of the slack portion is unstable. The prediction system according to this embodiment eliminates or minimizes these situations, and enables any operator to attach a cable with a constant service life guaranteed.

Next, a robot system 1 including a prediction system 50 according to this embodiment will be described by referring to FIG. 2. FIG. 2 is a diagram illustrating a configuration of the robot system 1. As shown in FIG. 2, the robot system 1 includes a robot 10, a welding timer 20, and a robot controller 30. The robot 10 is an articulated robot with a multi-axis structure including movable members capable of moving relative to each other using a plurality of joints. The robot 10 includes, at its distal end, a welding gun 19 as an end effector. The welding gun 19 includes a clamp 19a to clamp and weld a workpiece, and is mounted to a robot arm 10b through a base member 19c. A welding transformer 19b is mounted to the base member 19c.

A welding power source cable 401 is elongate from the welding timer 20 to the welding gun 19. A power supply/signal cable 402 is elongate from the robot controller 30 to the robot 10. The welding power source cable 401 and the power supply/signal cable 402 are bundled into a cable 40. The cable 40 has its base end disposed at an insertion portion of a cable distribution board 102a. The cable distribution board 102a is disposed in the base 10a of the robot 10. The cable 40 is mounted to each joint of the robot 10 with a slack portion disposed at each joint. The other end of the cable 40 is coupled to the welding transformer 19b.

The welding timer 20 controls welding conditions such as the period of time for power supply and the current amount associated with the welding performed by the welding gun 19. The robot controller 30 instructs the robot 10 to perform an operation of matching the position of the clamp 19a of the welding gun 19 with a welding point on a workpiece, not shown. The robot controller 30 includes a prediction system 50. The prediction system 50 will be described in detail later by referring to FIG. 5.

Figure 3:
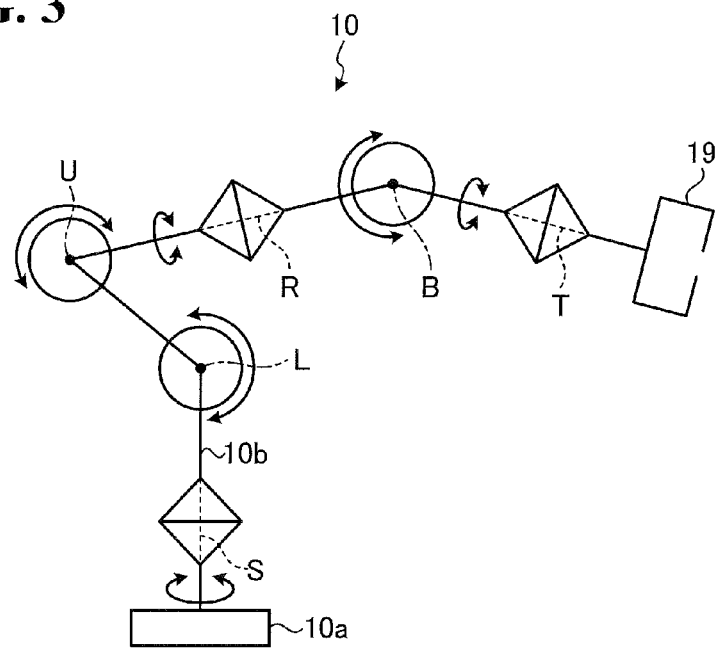
FIG. 3 is a diagram describing axes of a six-axis robot.

Next, the robot 10 will be described. FIG. 3 is a diagram describing axes of a six-axis robot. The robot 10 is secured to a floor or another surface through the base 10a. The robot 10 includes a plurality of robot arms 10b. One of the robot arms 10b is coupled to another one of the robot arms 10b through a joint driven by a servomotor, not shown.

Some of the joints shown in FIG. 3 are illustrated in "circle", while the other joints are illustrated in "diamond". The difference indicates a difference in the direction of the rotation axis. Specifically, the joint illustrated in "circle" rotates to change the angle between the robot arms 10b on both sides. The joint illustrated in "diamond" rotates while maintaining the angle between the robot arms 10b on both sides. As shown in FIG. 3, the rotation axes of the joints are axes S, L, U, R, B, and T arranged in this order from an installation reference surface.

In this embodiment, each of the joints corresponding to the axes except for the axes B and T is disposed between the fixed points on both ends of the corresponding one of the slack portions of the cable 40. The joints corresponding to the axes B and T are disposed between the fixed points on both ends. Specifically, the two axes B and T are disposed between the fixed points on both ends. This will be described later by referring to FIG. 8. The joints are capable of moving independently from each other.

Figure 4:
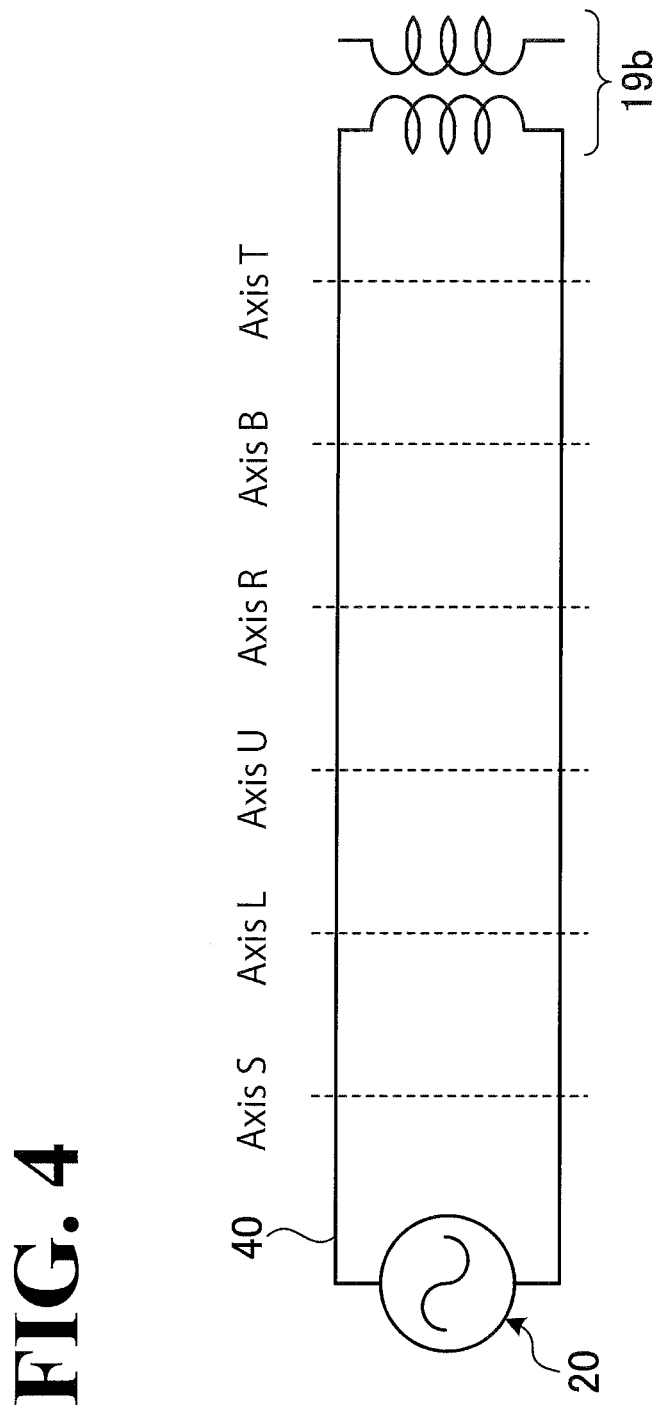
FIG. 4 is a diagram illustrating an equivalent circuit of a cable as viewed from a welding timer.

Next, a method for measuring the value of electric resistance in each slack portion of the cable 40 disposed at each axis of the robot 10 will be described. FIG. 4 is a diagram illustrating an equivalent circuit of the cable 40 as viewed from the welding timer 20. The welding transformer 19b and the welding timer 20 as an AC (Alternating Current) power source are coupled to each other through the cable 40 to form a closed circuit. The cable 40 shown in FIG. 4 denotes the welding power source cable 401.

Here, a relationship between the tensile strain and value of electric resistance of a material such as a cable will be described. Generally, when tensile force is applied to a tubular material from both ends of the tubular material, stress occurs in the tubular material, and tensile strain proportional to the stress occurs. When the tensile strain occurs, the cross-sectional area of the tubular material decreases while the length of the tubular material increases. As a result, the value of electric resistance in the tensioning direction of the tubular material increases. In the case of a wire-shape material as in this embodiment, the stress that occurs inside the material as the material is pulled in its longitudinal direction is proportional to the value of electric resistance in the tensioning direction of the material. Thus, this relationship may serve as a basis for a calculation to convert the value of electric resistance in the slack portion of the cable 40 into the stress that occurs inside the slack portion.

The method for measuring the value of electric resistance in a slack portion of the cable 40 will be described in detail. One slack portion among the plurality of slack portions in the cable 40 is selected. Then, only the axis of the robot 10 disposed within the selected slack portion is moved, and change in the value of electric resistance of the closed circuit is measured while the axis is in operation. Then, from the change in the value of electric resistance thus obtained, stress applied to the cable 40 that bends or extends in conjunction with the rotation of the axis in operation is calculated. A value obtained by dividing the difference between the maximum value and the minimum value of the stress by two is defined as stress amplitude σn. How the service life of the slack portion is predicted based on the stress amplitude σn will be described later.

Description will be made below with regard to an exemplary wrist movement of simultaneously moving the axes B and T of the robot 10. The following exemplary method can also be used for the other axes to obtain the stress amplitude σn in a target slack portion of the cable 40 for service life estimation. The method for measuring the value of electric resistance is not limited to a particular method. For example, an operator may measure the value of electric resistance in each slack portion using a tester, or a tester may be incorporated in the robot system 1 to automatically measure the electric resistance value.

In FIG. 4, V (V) denotes AC voltage and f (Hz) denotes frequency of the welding timer 20, which is a power source. L (H) denotes inductance and XL (Ω) (=2πfL) denotes reactance of a coil of the welding transformer 19b. It is assumed here that when the axes B and T are in movement, sum R0 (Ω) of the resistances on the closed circuit of the cable 40 without any stress rises to maximum electric resistance value $R1_{max}$ (Ω).

Where I (A) is current through the closed circuit of the cable 40, voltage VR (V) of I×R0 is applied to a resistor R0, and voltage VL (V) of I×XL is applied to the coil of the welding transformer 19b. In the coil, the phase of the current is delayed behind the voltage by π/2, and thus composite voltage $V_{tot}$ (V) of the above voltages is: $(VR^2+VL^2)^{0.5} = (R0^2+XL^2)^{0.5} \times I$. Thus, impedance Z0 (Ω)=$(R0^2+XL^2)^{0.5}$ is obtained. Similarly, impedance Z1 (Ω)=$(R1_{max}^2+XL^2)^{0.5}$ is obtained at the electric resistance value $R1_{max}$ (Ω). Thus, the amount of increase in the value of electric resistance of the cable 40 in conjunction with the movement of the axes B and T is obtained, as represented by $R1_{max}-R0=(Z1^2-XL^2)^{0.5}-(Z0^2-XL^2)^{0.5}$ (Ω). Specifically, the amplitude of change in the value of electric resistance of the cable 40 is calculated from the change in the impedance of the cable 40 caused by the movement of the axes B and T.

Figure 5:
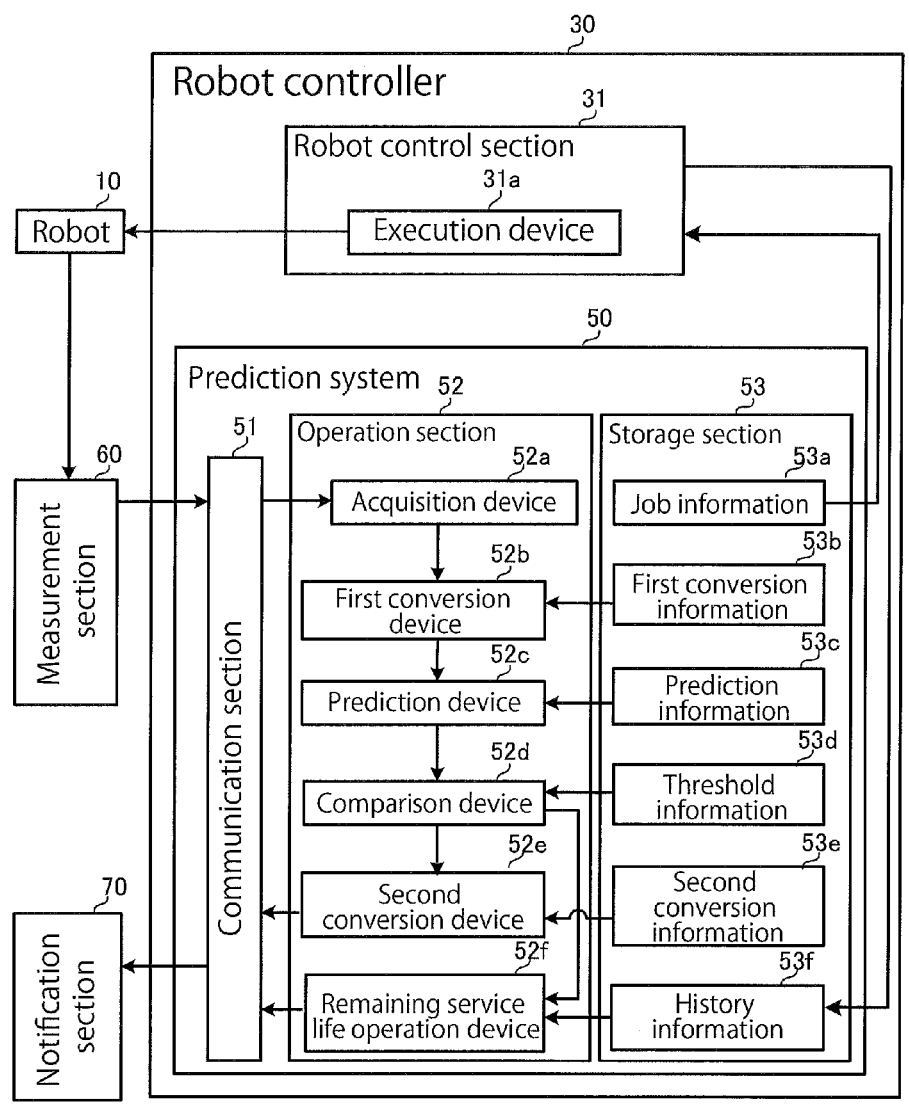
FIG. 5 is a block diagram of a configuration of a prediction system.

Next, the prediction system 50 will be described. FIG. 5 is a block diagram illustrating a configuration of the prediction system 50. While in this embodiment the prediction system 50 is incorporated in the robot controller 30, the prediction system 50 may be a separate system or may be incorporated in the robot 10.

The prediction system 50 is incorporated in the robot controller 30 together with a robot control section 31. The robot control section 31 includes an execution device 31a, which causes the robot 10 to execute a predetermined operation. The prediction system 50 includes a communication section 51, an operation section 52, and a storage section 53. The communication section 51 is a communication device such as a LAN board that transmits and receives data to and from a measurement section 60, the operation section 52, and a notification section 70, which are for electric resistance values. The storage section 53 includes a storage device such as a nonvolatile memory and a hard disc drive.

While the measurement section 60 is incorporated in the welding timer 20, the measurement section 60 may alternatively be a separate section or may be incorporated in the robot 10 or the robot controller 30. While the notification section 70 is incorporated in a programming pendant 32, described in detail later by referring to FIG. 6, the notification section 70 may alternatively be a separate section or may be incorporated in the robot 10, the welding timer 20, or the robot controller 30.

The operation section 52 includes an acquisition device 52a, a first conversion device 52b, a prediction device 52c, a comparison device 52d, a second conversion device 52e, and a remaining service life operation device 52f. The storage section 53 stores job information 53a, first conversion information 53b, prediction information 53c, threshold information 53d, second conversion information 53e, and history information 53f.

The robot 10 makes a first movement instructed by the execution device 31a. The first movement may be an operation of the robot 10 including an operation of a joint that brings a target slack portion into movement. Specifically, the first movement may be an operation of moving only the joint within the target slack portion, or may be an operation involved in actual work of the robot 10. In order to predict the service life under a more severe condition, the first movement may be an operation of moving the joint within the target slack portion to both limits of the movable range of the joint. Thus, the operation of the robot 10 may be set in various manners conveniently in accordance with purpose and situation associated with the service life evaluation.

For example, when there is enough space around the robot 10 as in shipping inspection, it is possible to perform the operation of moving each of the joints within the respective slack portions or perform the operation of moving each joint to both limits of the movable range of the joint, and then to employ a shortest predicted service life. It is also possible to perform an operation involved in actual work in a production line so as to predict the service life.

When the cable is replaced with a new cable after shipment, or when the work is changed, as described later, after the robot 10 has been placed on the production line, it is possible to predict the service life by performing an operation involved in actual work while ensuring that the robot 10 does not interfere with a peripheral object. The first movement and work-related operations are referred to as "jobs". The jobs are stored as job information 53a in advance, and can be identified by a number or a job name uniquely assigned to each job. The execution device 31a causes the robot 10 to execute a job read from the job information 53a.

The measurement section 60 measures the value of electric resistance of the cable 40 changing in accordance with the first movement of the robot 10. The electric resistance value may be measured by causing the robot to execute the first movement only once or a plurality of times. When the first movement is executed a plurality of times, it is possible to employ a maximum value of the amplitude of change in the electric resistance value during the plurality of times of measurement. Alternatively, it is possible to employ an average value of the amplitude of change in the electric resistance in the plurality of times of measurement. In either case, it is not necessary to constantly measure the electric resistance value while the robot 10 is actually working.

The communication section 51 transmits the measured electric resistance value to the acquisition device 52a. The first conversion device 52b uses the first conversion information 53b to convert the electric resistance value acquired by the acquisition device 52a into stress applied to the target slack portion.

Stress amplitude σ1 denotes the amplitude of change in the stress obtained by the conversion in the first conversion device 52b. Based on the stress amplitude σ1 and with the use of the prediction information 53c, the service life of the target slack portion is predicted. The service life ranges from a state without any wear on the target slack portion to breakage of the target slack portion due to the accumulation of wear. The following description is regarding the case where the load that the movement of the robot arm 10b applies to the slack portion of the cable 40 is equal to or less than an yield point of the cable 40, that is, the load is within an elastic range.

Generally, the wear-caused breakage through repeated application of load within the elastic range is caused by high-cycle wear with equal to or more than $10^4$ repetitions of load application before the breakage occurs. In this case, the service life that ends with the breakage is predicted using the following exemplary Formula (1). Formula (1) represents a relationship between the amplitude σ1 of stress applied to the slack portion of the cable 40 and the number of repetitions N1 at which the slack portion of the cable 40 is broken due to wear.

$$\sigma 1 \times N1^{a1} = C \tag{1}$$

From Formula (1), the number of repetitions N1 of the first movement of the robot 10 at which the slack portion of the cable 40 is disconnected due to wear can be predicted based on the stress amplitude σ1. In Formula (1), a1 and C are constants (real number) determined by an experiment performed on the cable 40 in advance. If N1 obtained in Formula (1) is not an integer, a closest integer is set as N1.

It is possible to determine N1 thus obtained as a first service life indicating the number of times the robot 10 is able to make the first movement. It is also possible to convert N1 into time based on the time required for the robot 10 to make the first operation once, and determine the converted N1 as the first service life.

The first service life of the cable 40 with respect to the first movement of the robot 10 predicted by the prediction device 52c is compared with the threshold information 53d by the comparison device 52d. An example of the threshold information 53d is a guaranteed value of the service life of the cable 40. When the first service life is shorter than the length indicated by the threshold information 53d, the data of the first service life is transmitted to the second conversion device 52e.

The second conversion device 52e uses the second conversion information 53e to convert the stress amplitude σ1 applied to the cable 40 into an adjusted length to be added to the slack portion of the cable 40. Through the communication section 51, the notification section 70 notifies the operator of the adjusted length obtained by the conversion and the calculation.

When the first service life is equal to or longer than the length indicated by the threshold information 53d, the notification section 70 notifies the operator of the data of the first service life through the remaining service life operation device 52f and the communication section 51. Here, the remaining service life operation device 52f will be described. The remaining service life operation device 52f subtracts the history information 53f from the acquired data of the first service life. The history information 53f is obtained by aggregating operation information of the robot 10 acquired from the robot control section 31. Then, the remaining service life operation device 52f transmits to the communication section 51 the value obtained by the subtraction as the first service life of the cable 40.

An actual production line may be subject to rearrangement that involves change of the work performed by the robot 10 from the original work (first movement) to different work (second movement). The following description is regarding calculation of the value of electric resistance of the cable 40 and prediction of the service life of the cable 40 in the case where the movement of the robot 10 changes from the first movement to the second movement.

When the operation of the robot 10 changes to the second movement, the measurement section 60 measures the value of electric resistance of the cable 40 that changes in conjunction with the second movement of the robot 10, similarly to the case of the first movement. The acquired electric resistance is converted into stress applied to the target slack portion. The following Formula (2) is used.

$$\sigma 2 \times N2^{a1} = C \quad (2)$$

where σ2 denotes the amplitude of stress applied to the slack portion of the cable 40.

Formula (2) represents a second service life N2 under the condition that the amplitude of stress σ2 is applied. The second service life N2 denotes the number of repetitions at which the slack portion of the cable 40 is broken due to wear from a state without any wear on the cable 40. When N2 obtained in Formula (2) is not an integer, a closest integer is set as N2. Assume that the stress amplitude σ1 is applied to the cable 40 N11 times, and then the stress amplitude changes to σ2. After the change, $N21_{max}$ repetitions are possible before the cable 40 is broken due to wear. $N21_{max}$ satisfies the following Formula (3).

$$N11/N1 + N21_{max}/N2 = 1 \quad (3)$$

Thus, when the comparison device 52d determines that the second service life N2 of the cable 40 with respect to the second movement of the robot 10 predicted by the prediction device 52c is equal to or longer than the length indicated by the threshold information 53d, then the remaining service life operation device 53f uses the following Formula (4) to calculate $N21_{max}$, which is the maximum service life after the movement has been changed to the second movement.

$$N21_{max} = (1 - N11/N1) \times N2 \quad (4).$$

$N21_{max}$ calculated using Formula (4) is updated by being subtracted by the history information 53f up to N21 of the second movement of the robot 10. Through the communication section 51, the updated $N21_{max}$ is transmitted to the notification section 70 as the second remaining service life of the cable 40. When $N21_{max}$ obtained in Formula (4) is not an integer, a closest integer is set as $N21_{max}$.

When the comparison device 52d determines that the second service life N2 of the cable 40 with respect to the second movement of the robot 10 predicted by the prediction device 52c is shorter than the length indicated by the threshold information 53d, the length of the slack portion is increased, similarly to the first movement. Then, arithmetic operation later than the calculation of $N21_{max}$ is performed.

The following description is regarding the case where the operation of the robot 10 is changed equal to or more than three times. For example, Nn denotes a service life with respect to a movement resulting from an (n−1)-th change (n is an integer equal to or more than four), and is determined to satisfy Formula (5). The service life Nn is a service life from a state without any wear on the target slack portion of the cable 40 to the wear-caused breakage of the slack portion.

$$\sigma n \times Nn^{a1} = C \quad (5)$$

When the comparison device 52d determines that the service life Nn is equal to or longer than the length indicated by the threshold information 53d, the remaining service life operation device 52f uses the following Formula (6) to calculate a remaining service life $Nn1_{max}$, which can be obtained by subtraction of the operating time of the robot 10 before the latest change of movement. When $Nn1_{max}$ obtained in Formula (6) is not an integer, a closest integer is set as $Nn1_{max}$.

$$Nn1_{max} = (1 - \Sigma(Ni1/Ni)) \times Nn \ (i=1 \text{ to } n-1) \quad (6)$$

When the comparison device 52d determines that the service life resulting from the change in the movement of the robot 10 is shorter than the length indicated by the threshold information 53d, the length of the slack portion is increased in such a manner that the service life with respect to the wear-caused breakage in Formula (5) is satisfied. Then, the arithmetic operation represented by Formula (6) is performed.

Thus, with the prediction system 50, by bringing the joint of the robot 10 on which the slack portion of the cable 40 into a predetermined operation at least once, the adjustment amount for the slack portion is calculated, and the remaining service life reflecting the operation history of the robot 10 is automatically calculated.

When the operation of the robot 10 is changed, the service life after the change in the operation is predicted by subtracting the entire operation history of the cable 40 before the change in the operation. This ensures recognition of the timing to replace the cable 40. Further, it is possible to make a notification of the remaining service life of each slack portion. This ensures recognition of the timing to replace the cable 40 based on disconnection of a slack portion that is first to break due to wear.

Figure 6:
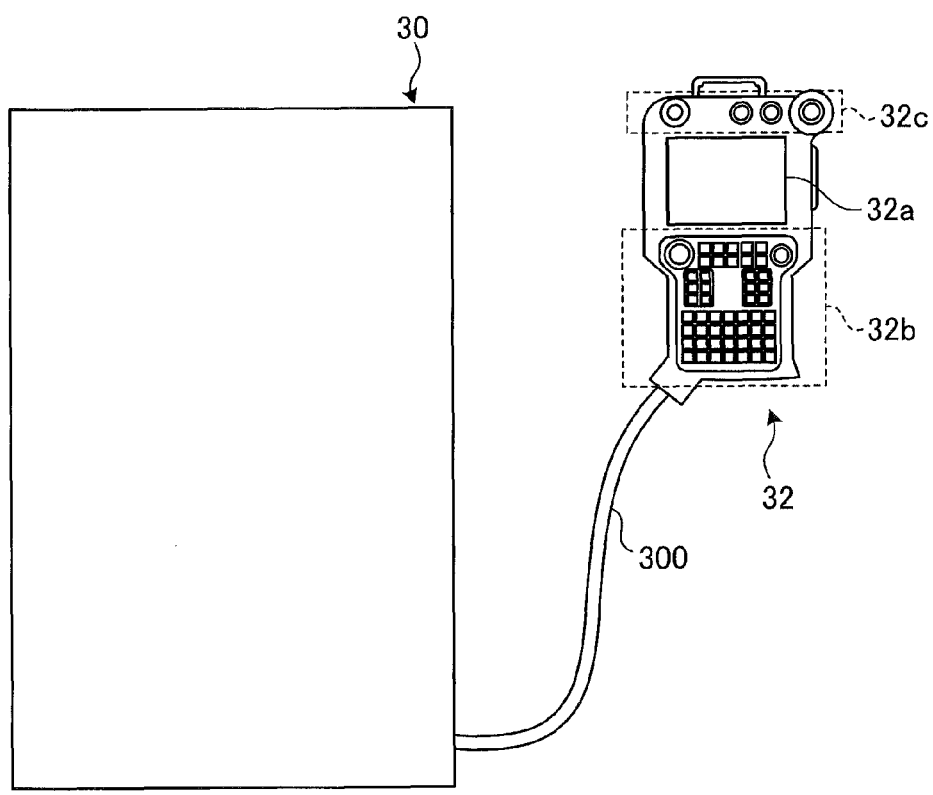
FIG. 6 is a diagram illustrating a programming pendant.

Next, the programming pendant 32 will be described by referring to FIG. 6. FIG. 6 is a diagram illustrating the programming pendant 32. The programming pendant 32 is a portable control panel used to teach a program to the robot 10 or bring the robot 10 into operation. The programming pendant 32 is coupled to the robot controller 30 through a cable 300.

The programming pendant 32 includes three module devices, namely, a graphical user interface (GUI) 32a, a solid user interface (SUI) 32b, and a safety solid user interface (Safety-SUI) 32c. The GUI 32a is a graphic human machine interface (HMI) such as a liquid crystal display and a touch switch. The SUI 32b is an HMI including mechanical/physical components, such as a push button switch and a selector switch for transmitting an intension of a person to a machine, and a light emitting diode signal lamp to notify the person of the state of the machine. The Safety-SUI 32c is an SUI directly related to safety, such as an emergency stop push-button switch and an enable switch.

The GUI 32a preferably serves as the notification section 70 of the prediction system 50 according to this embodiment, considering operability and cost. FIG. 7 is a diagram illustrating an operation window of the notification section 70. An operation of the prediction system 50 according to this embodiment will be described below by referring to the notification section 70 exemplified in FIG. 7.

The GUI 32a, which serves as the notification section 70, includes a job number display area 321, a job execution instruction area 322, an impedance value display area 323, a remaining service life display area 326, a service life determination display area 327, and a cable adjustment length display area 328. The impedance value is the electric resistance value. The robot 10 executes the job displayed on the job number display area 321 upon input of an instruction from the operator to the job execution instruction area 322.

The impedance value display area 323 includes areas 324 and 325. The areas 324 and 325 respectively display minimum and maximum impedance values of the cable 40 as a result of the operation of the robot 10. When the impedance value is measured manually using a tester or another device, the impedance value is input using the SUI 32b.

The service life of the cable 40 is predicted using the amplitude of change in the stress obtained by the conversion based on the input impedance value. When the service life is longer than the length indicated by the threshold information 53d, the service life determination display area 327 makes a positive display such as "OK" regarding a current installation condition of the slack portion of the cable 40 such as the length of the slack portion. The remaining service life display area 326 shows in hours a remaining service life of the cable 40 obtained by subtracting the history information 53f from the predicted value of the service life. The remaining service life display area 326 continuously shows a latest value updated by the remaining service life operation device 52f using the history information 53f.

When the predicted value of the service life of the cable 40 is smaller than the value of the threshold information 53d, the service life determination display area 327 makes a negative display such as "NG". The cable adjustment length display area 328 shows in centimeters the adjusted length of the slack portion of the cable 40. The adjusted length is obtained by converting the amplitude of change in the stress at the time when the electric resistance value is measured. At this point, the operator readjusts the length of the slack portion of the cable 40, and repeats a series of work that start from calling of the movement (job) of the robot 10. The series of work are repeated until the service life determination display device 327 makes a positive display such as "OK".

Thus, use of the GUI 32a of the programming pendant 32 as the notification section 70 ensures operation of the prediction system 50 using an existing interface device, without an additional special device.

Next, how the cable 40 is arranged in a wrist of the robot 10 will be described. FIG. 8 is a diagram illustrating how the cable is mounted to the wrist of the robot. First, a configuration of the wrist of the robot 10 will be described.

A cylindrical first wrist base 12 is mounted to a cylindrical upper arm 11 in a rotatable manner about the axis R. The first wrist base 12 and a cylindrical second wrist base 14 are mounted through a wrist swinging body 13, which is a joint, in a rotatable manner about the axis B. When the first wrist base 12 rotates about the axis R, the upper arm 11 is not rotated.

A wrist flange 15 is mounted to a distal end of the second wrist base 14 in a rotatable manner about the axis T. A first flange 16 is mounted to the wrist flange 15. The first flange 16 and a second flange 18 are coupled to each other through a pair of connection members 17. The pair of connection members 17 are mounted at positions offset from the axis T.

The welding gun 19, which is an end effector, is mounted to the second flange 18 through a base member 19c. The welding transformer 19b has its bottom mounted to the base member 19c, and is disposed in the space defined by the second flange 18 and the welding gun 19. The welding gun 19 includes the clamp 19a at the distal end of the welding gun 19. The clamp 19a clamps a workpiece.

The cable 40 is mounted to the arm of the robot 10 thus configured. The cable 40 is secured to the first wrist base 12 with a clamp 40a to enable the cable 40 to rotationally move along with the first wrist base 12. A portion of the cable 40 extending toward the distal end of the wrist passes through a guide space 100, which is defined by the first flange 16, the pair of connection members 17, and the second flange 18, and is coupled to the welding transformer 19b, which is disposed on the base member 19c.

A portion of the cable 40 between the guide space 100 and the welding transformer 19b is secured to the base member 19c with a clamp 40b. A portion of the cable 40 between the clamp 40a and the clamp 40b is a slack portion with a length enough to keep the slack portion from becoming tense when the wrist of the robot 10 makes rotational movement about the axes B and T.

In this embodiment, the clamp 40b is secured to the base member 19c. The clamp 40b may be disposed at any other position closer to the distal end of the arm beyond the wrist swing member 13. For example, the clamp 40b may be disposed on the second wrist base 14, the wrist flange 15, the first flange 16, the pair of connection members 17, the second flange 18, or the welding gun 19. This is because the cable 40 is able to follow the movement of the moving arm insofar as the wrist swinging body 13 is held in the slack portion of the cable 40, which is formed using the clamps 40a and 40b.

The guide space 100 has a cross-section in the insertion direction of the cable 40 with a diameter equal to or more than the diameter of the cable 40 in the vertical and horizontal directions. This ensures that the guide space 100 does not restrict the movement of the cable 40 in a linear direction when the wrist of the robot 10 moves. The pair of connection members 17 are disposed at positions offset from the axis T so as to ensure that the cable 40 does not interfere with the pair of connection members 17. Thus, a sufficient operable range about the axis T is ensured for the wrist flange 15.

The clamps 40a and 40b through which the cable 40 is passed fasten and secure the cable 40. Thus, once the length of the slack portion of the cable 40 between the clamps 40a and 40b is set, the length is not changed by the operation of the robot 10.

The adjustment member, not shown, of the cable 40 is disposed between the clamp 40b and the welding transformer 19b, for example. The adjustment member is used to adjust the length of the cable 40 between the clamps 40a and 40b, that is, the length of the slack portion.

The service life of the slack portion can be predicted by, with the cable 40 mounted on the robot 10, moving the joint in the slack portion of the cable 40 such as the axes B and T, and measuring the change in the value of electric resistance of the cable 40. For more accurate prediction of the service life, the operation of the axes B and T for measuring the change in the value of electric resistance is preferably a job that the robot 10 actually performs to weld the workpiece. In order to predict the service life under a more severe condition, the operation of moving the axes B and T may be to move the axes B and T from one end to the other end of the movable range of each of the axes B and T.

Figure 9:
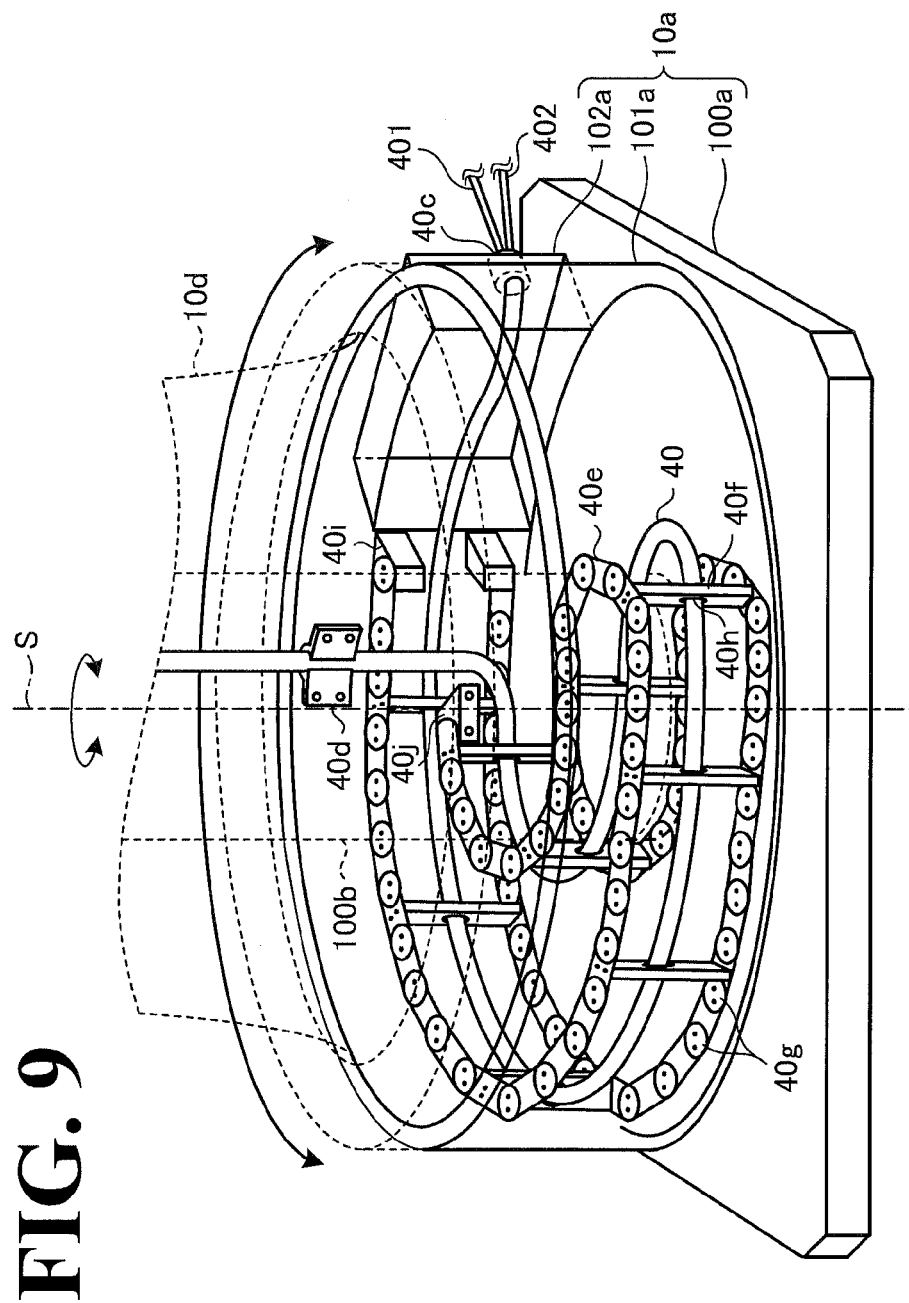
FIG. 9 is a diagram illustrating how the cable is arranged in a base of the robot.

Next, the slack portion of the cable 40 around the axis S will be described by referring to FIG. 9. FIG. 9 is a diagram illustrating how the cable 40 incorporated in the base 10a of the robot 10 is arranged. To facilitate the understanding of the description, the base 10a and a robot body 10d shown in FIG. 9 are partially or entirely transparent.

The base 10a includes a bottom plate 100a, a robot mounting base 101a, and the cable distribution board 102a. The bottom plate 100a is secured to the floor or another surface with bolts, not shown. The robot body 10d is mounted to the base 10a through a rotation bearing, not shown in a rotatable manner about the axis S. The robot body 10d includes a reducer in a swing shaft 100b.

The welding power source cable 401 and the power supply/signal cable 402 are secured by a clamp 40c, which is disposed in an insertion portion of the cable distribution board 102a, and are bundled into a single cable 40 with a covered wire for example. The cable 40 is drawn into the robot mounting base 101a and mounted to a cable supporting member 40e. The cable supporting member 40e includes a plurality of bridging plate pieces 40f supported between plate-shaped connection belts. The bridging plate pieces 40f each include a hole 40h. The plate-shaped connection belts are coupled together in a rotatable manner about a pair of upper and lower connection pivots 40g as viewed in FIG. 9. The cable supporting members 40e are bendable on a plane orthogonal to the longitudinal direction of the bridging plate piece 40f.

The cable 40 is inserted in the hole 40h of each bridging plate piece 40f of the cable supporting member 40e. The cable supporting member 40e has its base point secured to an inner side of the robot mounting base 101a by a fixing member 40i, and has the distal end secured to the swing shaft 100b by a fixing member 40j. The cable 40 is secured to the swing shaft 100b by the clamp 40d and forwarded toward the upper side of the robot body 10d.

In this embodiment, when the robot body 10d rotates about the axis S, the cable supporting member 40e secured by the fixing piece 40j and the cable 40 secured to the clamp 40d rotate along with the rotation of the swing shaft 100b. Thus, the cable supporting member 40e bends and extends/contracts in the space defined between the inner circumstance of the robot mounting base 101a and the outer circumstance of the swing shaft 100b.

By measuring the value of electric resistance of the portion of the cable 40 between the clamps 40c and 40d in the meantime, the service life of the portion can be predicted based on the measured electric resistance value. For more accurate prediction of the service life, the operation of the axis S for measuring the change in the value of electric resistance is preferably a job that the robot 10 actually performs to weld the workpiece. In order to predict the service life under a more severe condition, the operation of moving the axis S may be to move the axis S from one end to the other end of the movable range of the axis S.

Figure 10:
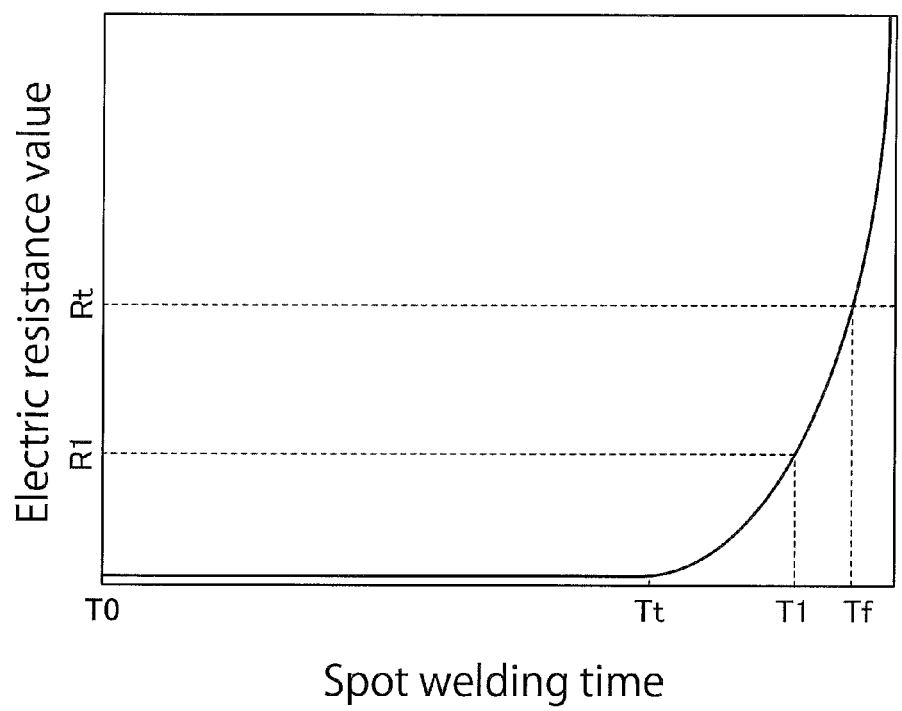
FIG. 10 is a graph illustrating a change over time in value of electric resistance of the cable relative to spot welding time.

As shown in FIG. 10, the value of electric resistance of the cable 40 that is broken due to wear rises exponentially from a time point Tt. FIG. 10 is a graph illustrating a change over time in value of electric resistance of the cable 40 relative to spot welding time. In the conventional method of continuously monitoring the electric resistance value, it is not until a time point T1 that a time point Tf, at which an electric resistance value Rt defined as a disconnection, is obtained. At the time point T1, the cable 40 has an electric resistance of R1, which is a threshold at which to predict the disconnection. In this case, the time period between the prediction of the disconnection of the cable 40 and the actual disconnection of the cable 40, that is, Tf to T1, is so short that it is difficult or impossible to make the prediction sufficiently before the breakage.

In contrast, with the prediction system 50 according to this embodiment, it is at the time point T0, which is when the cable 40 is mounted to the robot 10, that the time point Tf, which is defined as the disconnection of the cable 40, is predicted. The operation (job) of the robot 10 for predicting the disconnection of the cable 40 may be performed before the actual production.

Figure 11:
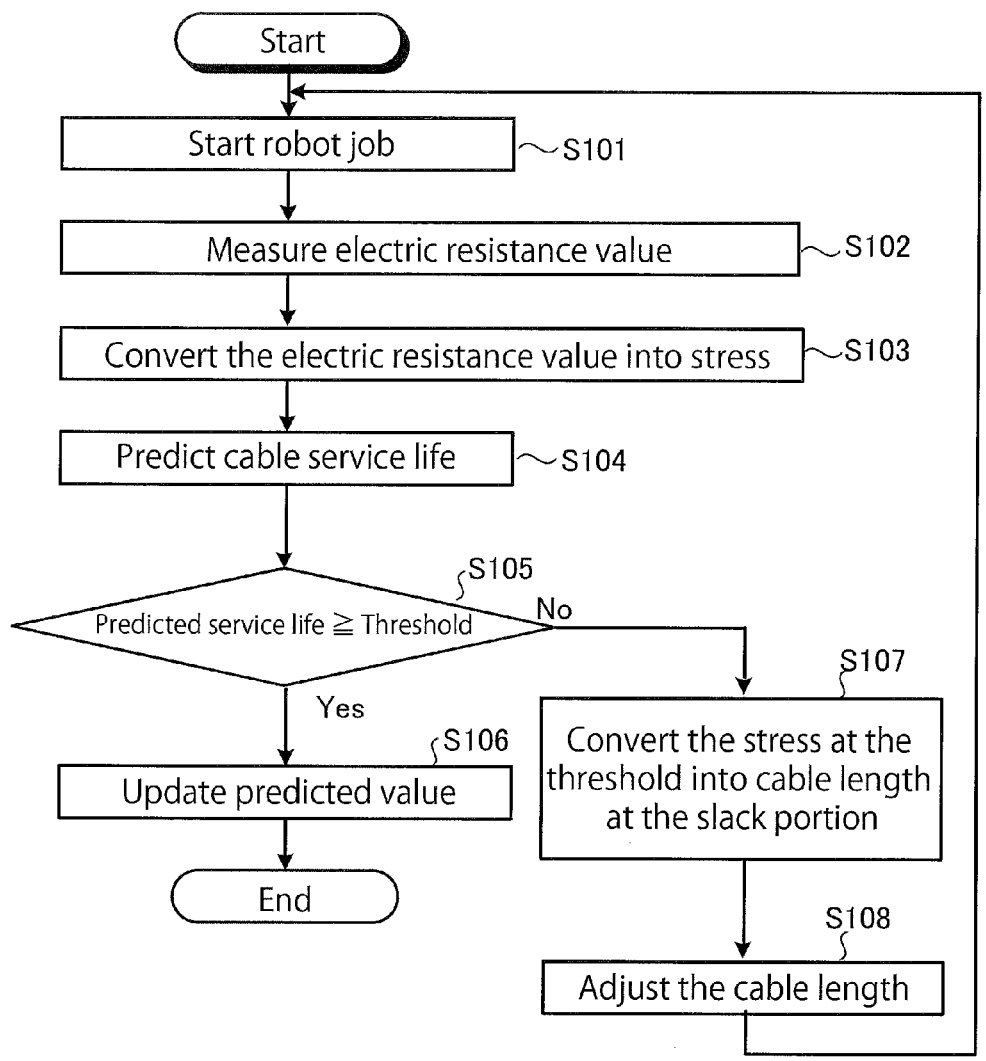
FIG. 11 is a flowchart of a procedure of processing executed by the prediction system.

Next, a procedure of processing executed by the prediction system 50 according to this embodiment will be described by referring to FIG. 11. FIG. 11 is a flowchart of a procedure of processing executed by the prediction system 50. As shown in FIG. 11, the execution device 31a starts an operation of the joint in the slack portion of the target cable 40 of the robot 10 (step S101). The measurement section 60 measures the value of electric resistance of the cable 40 changing along with the operation (step S102).

The value of electric resistance transmitted through the communication section 51 and the acquisition device 52a to the first conversion device 52b is converted into stress (step S103), and the stress is transmitted to the prediction device 52c. The prediction device 52c predicts the service life of the target slack portion of the cable 40 from the amplitude of change in the stress obtained by the conversion (step S104). The comparison device 52d determines whether the predicted service life is longer than the length indicated by the threshold information 53d, which indicates a threshold of the service life (step S105).

When the predicted service life is equal to or longer than the length indicated by the threshold information 53d, which indicates a threshold of the service life (step S105, Yes), the remaining service life operation device 52f updates the history information 53f and the processing ends (step S106). The updating procedure for the predicted value of the service life will be described in detail later by referring to FIG. 12. When the predicted service life of the cable 40 is shorter than the length indicated by the threshold information 53d, which indicates a threshold of the service life (step S105, No), the second conversion device 52e converts the amplitude of change in the stress applied to the cable 40 obtained by the conversion into an adjusted length of the target slack portion of the cable 40 (step S107). The operator adjusts the cable length of the target slack portion in accordance with the adjusted length obtained by the conversion (step S108). Then, the processing at and after step S101 is repeated.

Figure 12:
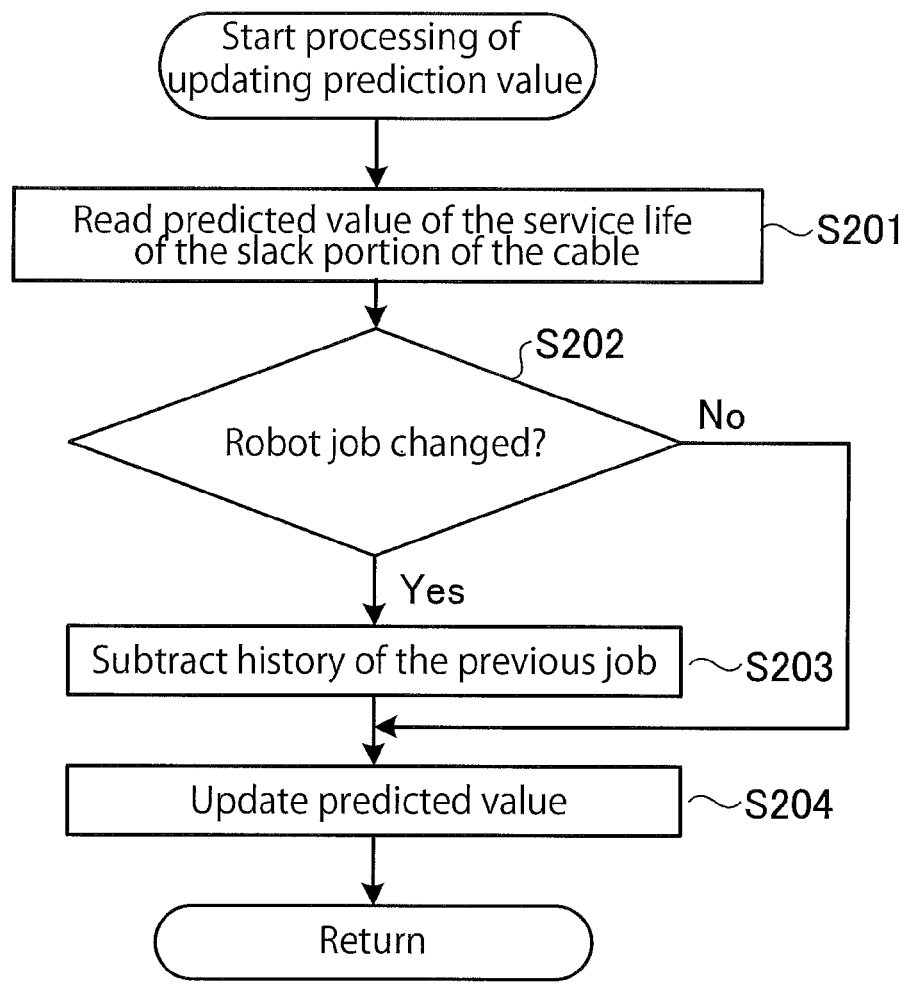
FIG. 12 is a flowchart of a procedure of processing of updating a predicted value.

Next, description will be made in detail by referring to FIG. 12 with regard to a procedure of processing of updating the predicted value of the service life of the slack portion of the cable 40 at step S106 shown in FIG. 11. FIG. 12 is a flowchart of a procedure of processing of updating the predicted value.

The remaining service life operation device 52f reads the corresponding predicted value of the service life of the slack portion of the cable 40 from the comparison device 52d (step S201). Then, the remaining service life operation device 52f determines whether the job of the robot 10 has been changed (step S202). When the job has been changed (step S202, Yes), the remaining service life operation device 52f subtracts the history information 53f of the operation of the robot 10 in the previous job from the predicted value of the service life of the slack portion of the cable 40 (step S203). Then, the remaining service life operation device 52f subtracts the history information 53f of the operation of the robot 10 in the latest job from the predicted value so as to update the predicted value of the service life of the cable 40 (step S204). When the result of the determination at step S202 is "No", the processing bypasses step S203 and proceeds to step S204.

As has been described hereinbefore, the prediction system according to this embodiment includes an acquisition device, an execution device, and a prediction device. The acquisition device acquires a value of electric resistance of a cable secured by fixing members to a pair of link members configured to rotate relative to each other through a joint. The execution device causes the joint to execute a predetermined operation. The prediction device predicts the service life of the cable based on a change in the value of electric resistance acquired by the acquisition device while the execution device is causing the joint to execute the predetermined operation.

Thus, the prediction system according to this embodiment is capable of estimating a disconnection of a cable sufficiently before the disconnection occurs, without using a special device to continuously monitor the value of electric resistance of the cable.

The end effector of the robot exemplified in the description of the prediction system according to this embodiment is not limited to welding use. The end effector may be used in various other applications including painting, sealing, polishing, and handling. That is, the end effector may be a paint spray gun, a sealing nozzle, a polisher, a mechanical hand, or any other device.

The application of the prediction system according to this embodiment is not limited to a cable disposed on an arm of a robot. The prediction system according to this embodiment may be applied to any other cable mounted to members capable of moving relative to each other through a joint such as a hinge, a flexible joint, and a universal joint. The prediction system according to this embodiment may be used in a wide variety of applications including parts performing operations such as opening/closing, withdrawing, and pressing in various industrial machines, machine tools, movement machines, transfer machines, and electronic devices. Examples of the cables include, but are not limited to, a wire disposed over a hinge for opening and closing a door of an automobile, and a wire disposed over a hinge for coupling a display panel to an apparatus main body of an electronic device.

Obviously, numerous modifications and variations of the present disclosure are possible in light of the above teachings. It is therefore to be understood that within the scope of the appended claims, the present disclosure may be practiced otherwise than as specifically described herein.

What is claimed as new and desired to be secured by Letters Patent of the United States is:

1. A prediction system comprising:
    an acquisition device configured to acquire a value of electric resistance of a cable secured by fixing members to a pair of link members configured to rotate relative to each other through a joint;
    an execution device configured to cause the joint to execute a predetermined operation; and
    a prediction device configured to predict a service life of the cable based on a change in the value of electric resistance acquired by the acquisition device while the execution device is causing the joint to execute the predetermined operation, wherein
    when the predetermined operation is changed, the prediction device is configured to predict a new service life based on a new predetermined operation after the change, configured to calculate an elapse of time based on an execution history of the predetermined operation before the change, configured to subtract the elapse of time from the new service life, and configured to set a resulting difference value as a predicted value.

2. The prediction system according to claim 1, further comprising:
    a first conversion device configured to convert the value of electric resistance into a value of stress applied to the cable;
    a comparison device configured to compare the service life predicted by the prediction device with a threshold determined in advance in accordance with a type of the cable; and
    a second conversion device configured to, when the service life is shorter than the threshold as compared by the comparison device, convert the value of stress converted by the first conversion device into an increment amount indicating an increase to be made in a cable length between the fixing members.

3. The prediction system according to claim 1, wherein the predetermined operation comprises a unit operation as a unit of repetitive operations including an operation of the joint.

4. The prediction system according to claim 1, wherein the predetermined operation comprises an operation of moving the joint to both limits of a movable range of the joint.

5. The prediction system according to claim 1, further comprising a remaining service life operation device configured to, based on the execution history of the predetermined operation, calculate a remaining service life at a latest time point from the service life predicted by the prediction device.

6. The prediction system according to claim 1,
    wherein the joint corresponds to a joint of an articulated robot, and the link members correspond to arms of the articulated robot,
    wherein the cable is disposed along the arms of the articulated robot, and
    wherein the execution device is configured to cause at least one joint disposed between the arms provided with the fixing members.

7. The prediction system according to claim 6, wherein data is input and output on a teaching operation board of the articulated robot.

8. The prediction system according to claim 2, wherein the predetermined operation comprises a unit operation as a unit of repetitive operations including an operation of the joint.

9. The prediction system according to claim 2, wherein the predetermined operation comprises an operation of moving the joint to both limits of a movable range of the joint.

10. The prediction system according to claim 2, further comprising a remaining service life operation device configured to, based on the execution history of the predetermined operation, calculate a remaining service life at a latest time point from the service life predicted by the prediction device.

11. The prediction system according to claim 3, further comprising a remaining service life operation device configured to, based on the execution history of the predetermined operation, calculate a remaining service life at a latest time point from the service life predicted by the prediction device.

12. The prediction system according to claim 4, further comprising a remaining service life operation device configured to, based on the execution history of the predetermined operation, calculate a remaining service life at a latest time point from the service life predicted by the prediction device.

13. The prediction system according to claim 8, further comprising a remaining service life operation device configured to, based on the execution history of the predetermined operation, calculate a remaining service life at a latest time point from the service life predicted by the prediction device.

14. The prediction system according to claim 9, further comprising a remaining service life operation device configured to, based on the execution history of the predetermined operation, calculate a remaining service life at a latest time point from the service life predicted by the prediction device.

* * * * *